(12) United States Patent
Suzuki

(10) Patent No.: US 11,410,938 B2
(45) Date of Patent: Aug. 9, 2022

(54) SEMICONDUCTOR PACKAGE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Miwako Suzuki, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 48 days.

(21) Appl. No.: 17/012,371

(22) Filed: Sep. 4, 2020

(65) Prior Publication Data
US 2021/0280532 A1 Sep. 9, 2021

(30) Foreign Application Priority Data
Mar. 5, 2020 (JP) .............................. JP2020-038055

(51) Int. Cl.
| | |
|---|---|
| *H01L 23/00* | (2006.01) |
| *H01L 23/495* | (2006.01) |
| *H01L 21/48* | (2006.01) |
| *H01L 21/56* | (2006.01) |
| *H01L 23/31* | (2006.01) |

(52) U.S. Cl.
CPC ........ *H01L 23/562* (2013.01); *H01L 21/4853* (2013.01); *H01L 21/565* (2013.01); *H01L 23/3114* (2013.01); *H01L 23/4952* (2013.01); *H01L 23/49513* (2013.01); *H01L 23/49562* (2013.01); *H01L 24/32* (2013.01); *H01L 24/48* (2013.01); *H01L 24/73* (2013.01); *H01L 2224/32245* (2013.01); *H01L 2224/48245* (2013.01); *H01L 2224/73265* (2013.01); *H01L 2924/13091* (2013.01); *H01L 2924/3512* (2013.01)

(58) Field of Classification Search
CPC ... H01L 23/562; H01L 23/3114; H01L 21/565
See application file for complete search history.

(56) References Cited

U.S. PATENT DOCUMENTS 8,017,447 B1 * 9/2011 Olsen ...................... H01L 24/97
257/E23.037

FOREIGN PATENT DOCUMENTS

| JP | 2001-127212 A | 5/2001 |
|---|---|---|
| JP | 2012-195330 A | 10/2012 |
| JP | 2014-096488 A | 5/2014 |

* cited by examiner

*Primary Examiner* — Walter H Swanson
(74) *Attorney, Agent, or Firm* — Foley & Lardner LLP

(57) ABSTRACT

According to one embodiment, a semiconductor package includes a semiconductor chip, a sealing resin that has a flat plate shape and seals the semiconductor chip inside, a first electrode that includes a first mounting surface exposed on a first main face of the sealing resin, a second electrode that includes a second mounting surface exposed on the first main face, and a groove provided on the first main face. The first mounting surface includes a first end portion arranged in an inner region of the first main face and opposed to the second electrode. The groove includes a first connection portion connected to the first end portion, and a second connection portion connected to a lateral face of the sealing resin.

18 Claims, 7 Drawing Sheets

SEMICONDUCTOR PACKAGE

CROSS-REFERENCE TO RELATED APPLICATIONS

This application is based upon and claims the benefit of priority from Japanese Patent Application No. 2020-038055, filed on Mar. 5, 2020; the entire contents of which are incorporated herein by reference.

FIELD

Embodiments of the present invention described herein relate generally to a semiconductor package.

BACKGROUND

As a semiconductor package, there is a surface mount type package that meets the demand for miniaturization. In the surface mount type package, each electrode of the package is mounted on a printed board or the like at the bottom face of the package, so the area necessary for mounting can be reduced.

However, the electrode to be surface-mounted in this way has a relatively large mounting surface, and gas bubbles may remain inside the solder that fixes the electrode at the mounting surface.

DETAILED DESCRIPTION

In general, according to one embodiment, a semiconductor package includes a semiconductor chip, a sealing resin that has a flat plate shape and seals the semiconductor chip inside, a first electrode that includes a first mounting surface exposed on a first main face of the sealing resin, a second electrode that includes a second mounting surface exposed on the first main face, and a groove provided on the first main face. The first mounting surface includes a first end portion arranged in an inner region of the first main face and opposed to the second electrode. The groove includes a first connection portion connected to the first end portion, and a second connection portion connected to a lateral face of the sealing resin.

Hereinafter, the present invention will be explained below in detail with reference to the accompanying drawings. The present invention is not limited to the following embodiments. The constituent elements in the following embodiments encompass those which can be easily assumed by a person skilled in the art, or which are substantially equivalent thereto.

Embodiment 1

A detailed explanation will be given of an embodiment 1 with reference to some of the accompanying drawings.

(Configuration Example of Semiconductor Package)

Figure 1A:
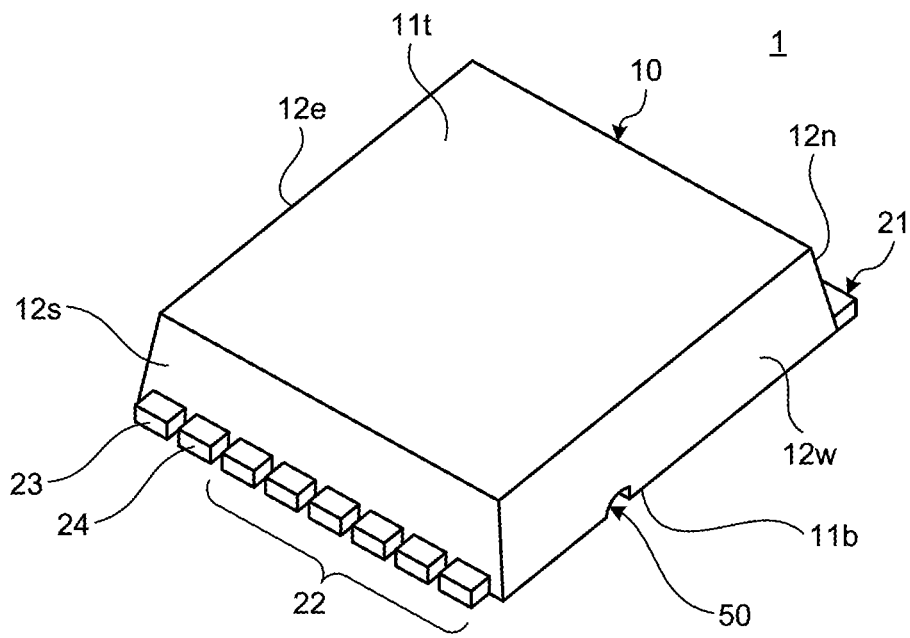
FIGS. 1A and 1B are perspective views illustrating a configuration example of a semiconductor package according to an embodiment 1.
Figure 1B:
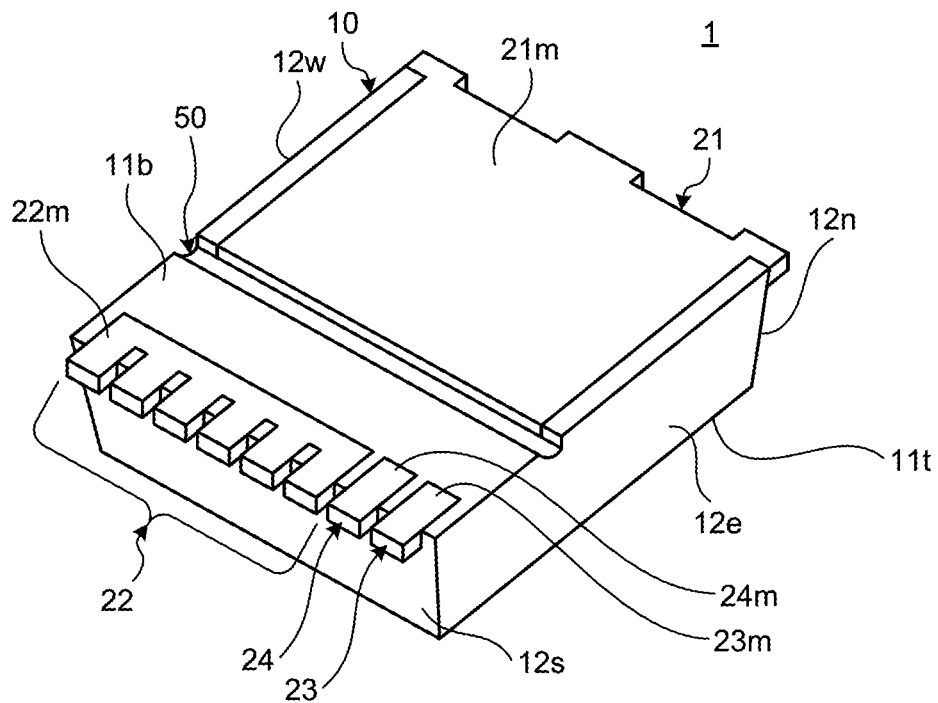

FIGS. 1A and 1B are perspective views illustrating a configuration example of a semiconductor package 1 according to an embodiment 1. FIG. 1A illustrates the top face side of the semiconductor package 1, and FIG. 1B illustrates the bottom face side of the semiconductor package 1.

As illustrated in FIGS. 1A and 1B, the semiconductor package 1 includes a sealing resin (sealing resin member, sealing resin material) 10, a drain electrode 21, a source electrode 22, a gate electrode 23, and a signal source pin 24. Further, the semiconductor package 1 includes a semiconductor chip (not illustrated) inside the sealing resin member 10.

The sealing resin member 10 is formed in a substantially flat plate shape that has a bottom face 11b as a first main face and a top face 11t as a second main face. Further, each of the bottom face 11b and the top face 11t of the sealing resin member 10 is rectangular, for example, and thus the sealing resin member 10 has four lateral faces 12e, 12w, 12n, and 12s. The lateral faces 12e and 12w are opposite to each other, and the lateral faces 12n and 12s are opposite to each other. The sealing resin member 10 includes a groove 50 as a first groove on the bottom face 11b.

Each of the drain electrode 21 as a first electrode, the source electrode 22 as a second electrode, the gate electrode 23 as a third electrode, and the signal source pin 24 are made of a metal, such as Cu, for example. The drain electrode 21 is arranged, for example, near the lateral face 12n of the sealing resin member 10, and the source electrode 22, the gate electrode 23, and the signal source pin 24 are arranged, for example, near the lateral face 12s of the sealing resin member 10 opposite to the lateral face 12n.

The drain electrode 21 includes a mounting surface 21m as a first mounting surface, which is exposed on the bottom face 11b of the sealing resin member 10. The source electrode 22 includes a mounting surface 22m as a second mounting surface, which is exposed on the bottom face 11b of the sealing resin member 10. The gate electrode 23 includes a mounting surface 23m as a third mounting surface, which is exposed on the bottom face 11b of the sealing resin member 10. The signal source pin 24 includes a mounting surface 24m exposed on the bottom face 11b of the sealing resin member 10. The mounting surface 21m of the drain electrode 21 has an area larger than that of each of the mounting surfaces 22m and 23m of the source electrode 22 and the gate electrode 23, for example.

These mounting surfaces 21m, 22m, 23m, and 24m are in a substantially flat state with respect to the bottom face 11b of the sealing resin member 10 (substantially the same height), so that, for example, the semiconductor package 1 is configured as a surface mount type package, which is to be surface-mounted by a solder on a printed board or the like. More specifically, the semiconductor package 1 may be a TO-Leadless (TOLL) package, for example.

Figure 2A:
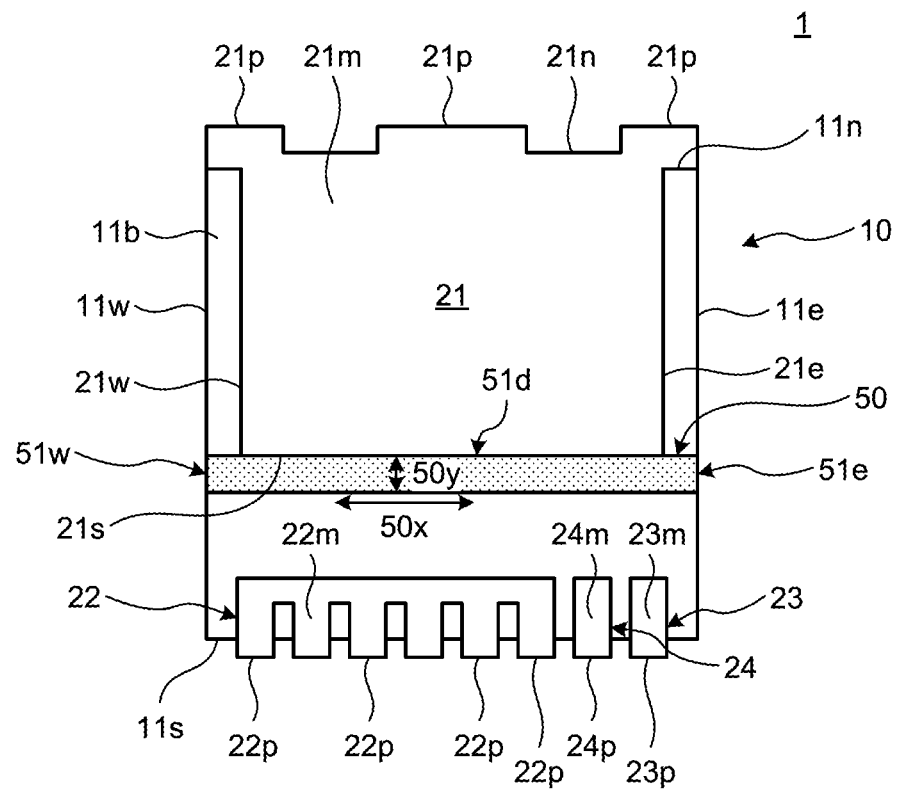
FIGS. 2A and 2B are schematic diagrams illustrating the configuration example of the semiconductor package according to the embodiment 1.
Figure 2B:
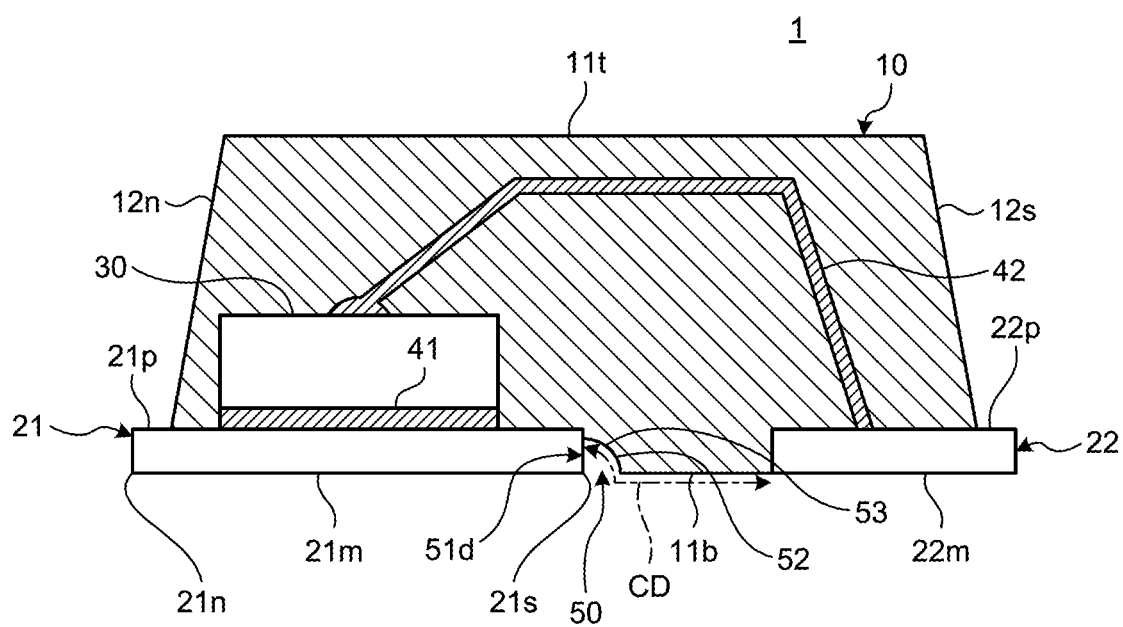

FIGS. 2A and 2B are schematic diagrams illustrating the configuration example of the semiconductor package 1 according to the embodiment 1. FIG. 2A is a plan view illustrating the bottom face side of the semiconductor package 1, and FIG. 2B is a sectional view of the semiconductor package 1 along the extending direction of the lateral faces 12$e$ and 12$w$ of the sealing resin member 10.

As illustrated in FIG. 2A, the bottom face 11$b$ of the sealing resin member 10 includes an end portion 11$e$ corresponding to the base of the lateral face 12$e$ of the sealing resin member 10, an end portion 11$w$ corresponding to the base of the lateral face 12$w$, an end portion 11$n$ corresponding to the base of the lateral face 12$n$, and an end portion 11$s$ corresponding to the base of the lateral face 12$s$.

The mounting surface 21$m$ of the drain electrode 21 has a substantially rectangular shape smaller than the bottom face 11$b$ of the sealing resin member 10. The mounting surface 21$m$ includes end portions 21$e$, 21$w$, 21$n$, and 21$s$ that respectively extend along the end portions 11$e$, 11$w$, 11$n$, and 11$s$ of the bottom face 11$b$ of the sealing resin member 10. Specifically, the end portions 21$e$ and 21$w$ are opposite to each other, and the end portions 21$n$ and 21$s$ are opposite to each other. Further, the end portions 21$e$ and 21$w$ and the end portions 21$n$ and 21$s$ extend in directions intersecting with each other, such that the end portions 21$e$ and 21$w$ are positioned one on either side of the extending direction of the end portions 21$n$ and 21$s$, and the end portions 21$n$ and 21$s$ are positioned one on either side of the extending direction of the end portions 21$e$ and 21$w$.

Here, for example, the expression that the end portion 21$e$ extends along the end portion 11$e$ includes a case where the end portions 21$e$ and 11$e$ are completely parallel to each other, and a case where the end portions 21$e$ and 11$e$ are substantially parallel to each other, e.g., within a manufacturing error range. Further, for example, the expression that the end portion 21$e$ and the end portion 21$n$ extend in directions intersecting with each other includes a case where the end portion 21$e$ and the end portion 21$n$ are completely orthogonal to each other, and a case where the end portion 21$e$ and the end portion 21$n$ are substantially orthogonal to each other, e.g., within a manufacturing error range. These points are also true for the following explanations.

The three end portions 21$e$, 21$w$, and 21$s$ of the mounting surface 21$m$ are arranged, for example, in the inner region of the bottom face 11$b$ of the sealing resin member 10. The inner region of the bottom face 11$b$ means a region that is present closer to the central side than the respective end portions 11$e$, 11$w$, 11$n$, and 11$s$ of the bottom face 11$b$ and does not overlap with at least the end portions 11$e$, 11$w$, 11$n$, and 11$s$.

The end portion 21$s$ as a first end portion of the mounting surface 21$m$ is opposed to the source electrode 22, the gate electrode 23, and the signal source pin 24, which are arranged near the lateral face 12$s$ of the sealing resin member 10. The end portions 21$e$ and 21$w$ as second end portions of the mounting surface 21$m$ are respectively present in the vicinity of the end portions 11$e$ and 11$w$ of the bottom face 11$b$ of the sealing resin member 10, and are opposed to the end portions 11$e$ and 11$w$.

For example, one end portion 21$n$ of the mounting surface 21$m$ projects outward from the end portion 11$n$ of the bottom face 11$b$ of the sealing resin member 10, and includes a plurality of projecting portions 21$p$ that further project from the end portion 21$n$ itself.

The mounting surface 22$m$ of the source electrode 22 is arranged in the vicinity of the end portion 11$s$ of the bottom face 11$b$ of the sealing resin member 10, and has a comb-like shape extending along the end portion 11$s$. The end portions of the mounting surface 22$m$ corresponding to the comb teeth are present as a plurality of projecting portions 22$p$ that project outward from the end portion 11$s$ of the bottom face 11$b$ of the sealing resin member 10.

The mounting surface 23$m$ of the gate electrode 23 is arranged in the vicinity of the end portion 11$s$ of the bottom face 11$b$ of the sealing resin member 10, and has a rectangular shape. The end portion of this rectangular shape is present as a projecting portion 23$p$ that projects outward from the end portion 11$s$ of the bottom face 11$b$ of the sealing resin member 10.

The mounting surface 24$m$ of the signal source pin 24 is arranged in the vicinity of the end portion 11$s$ of the bottom face 11$b$ of the sealing resin member 10, and has a rectangular shape. The end portion of this rectangular shape is present as a projecting portion 24$p$ that projects outward from the end portion 11$s$ of the bottom face 11$b$ of the sealing resin member 10.

As illustrated in FIG. 2B, a semiconductor chip 30 is sealed inside the sealing resin member 10. The lower surface of the semiconductor chip 30 is bonded by, for example, a solder 41 to the upper surface of the drain electrode 21, i.e., the surface opposite to the mounting surface 21$m$. The upper surface of the semiconductor chip 30 is connected by, for example, a wire 42 to the upper surface of the source electrode 22, i.e., the surface opposite to the mounting surface 22$m$. The semiconductor chip 30 is also connected to the gate electrode 23 and the signal source pin 24 by wires or the like (not illustrated).

For example, the semiconductor chip 30 is such a semiconductor chip or the like that includes a Metal Oxide Semiconductor Field Effect Transistor (MOSFET) formed therein. For example, MOSFETs include a High Voltage-MOS (HV-MOS), a Low Voltage-MOS (LV-MOS), and so forth.

As illustrated in FIGS. 2A and 2B, the bottom face 11$b$ of the sealing resin member 10 is provided with a groove 50 as a first groove. The groove 50 is arranged in contact with the end portion 21$s$ included in the mounting surface 21$m$ of the drain electrode 21, and extends along the end portion 21$s$. Specifically, an end portion 51$d$ of the groove 50 on one side in the transverse direction 50$y$ is connected to the end portion 21$s$ of the mounting surface 21$m$. Further, two end portions 51$e$ and 51$w$ of the groove 50 in the extending direction 50$x$ are respectively connected to the lateral faces 12$e$ and 12$w$ of the sealing resin member 10.

Here, the end portion 51$d$ of the groove 50 on one side in the transverse direction 50$y$ is an example of a first connection portion, and each of the end portions 51$e$ and 51$w$ of the groove 50 in the extending direction 50$x$ is an example of a second connection portion.

With the configuration described above, the groove 50 sets the end portion 21$s$ of the mounting surface 21$m$ of the drain electrode 21 to communicate with the outside of the sealing resin member 10, from the lateral faces 12$e$ and 12$w$ of the sealing resin member 10. However, it suffices that at least one of the end portions 51$e$ and 51$w$ of the groove 50 in the extending direction 50$x$ is connected to one of the lateral faces 12$e$ and 12$w$ of the sealing resin member 10. Also with this arrangement, the end portion 21$s$ of the mounting surface 21m of the drain electrode 21 is set to communicate with the outside of the sealing resin member 10.

Further, the groove 50 includes a lateral surface 52 and a bottom surface 53. The lateral surface 52 of the groove 50 is arranged at the end portion on the other side of the groove 50 in the transverse direction 50y, i.e., the end portion opposite to the end portion 51d. Where it is assumed that the depth direction of the groove 50 is defined by a direction from the bottom face 11b with the groove 50 formed thereon toward the center in the thickness direction of the sealing resin member 10, the lateral surface 52 extends in the depth direction of the groove 50, and is connected to the bottom surface 53 by a curved surface. Further, the depth of the groove 50 is less than the thickness of the drain electrode 21, for example.

Here, the lateral surface 52 and the bottom surface 53 of the groove 50 may be formed planar, and the lateral surface 52 and the bottom surface 53 may be connected in an L-shape in the cross section illustrated in FIG. 2B.

Further, since the bottom face 11b of the sealing resin member 10 is provided with the groove 50, the creepage distance CD between the drain electrode 21 and the source electrode 22 is elongated as compared with a case where the bottom face of the sealing resin member is flat, for example. The creepage distance CD is the shortest distance along the surface of the insulating member, i.e., the sealing resin member 10, which is interposed between the drain electrode 21 and the source electrode 22. As the creepage distance CD is longer, the insulation between drain electrode 21 and source electrode 22 is more enhanced.

(Method of Manufacturing Semiconductor Package)

Figure 3A:
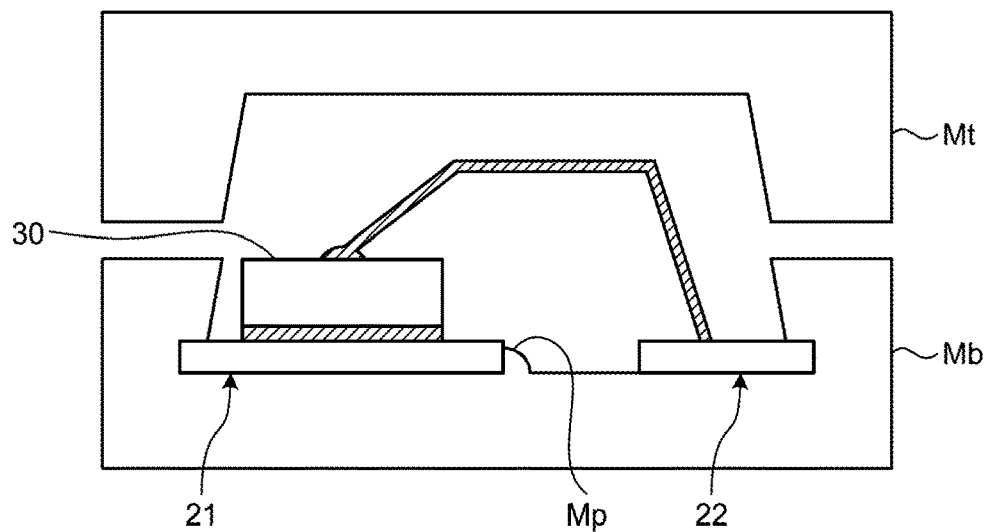
FIGS. 3A to 3C are sectional views illustrating an example of procedures of a method of manufacturing the semiconductor package according to the embodiment 1.
Figure 3B:
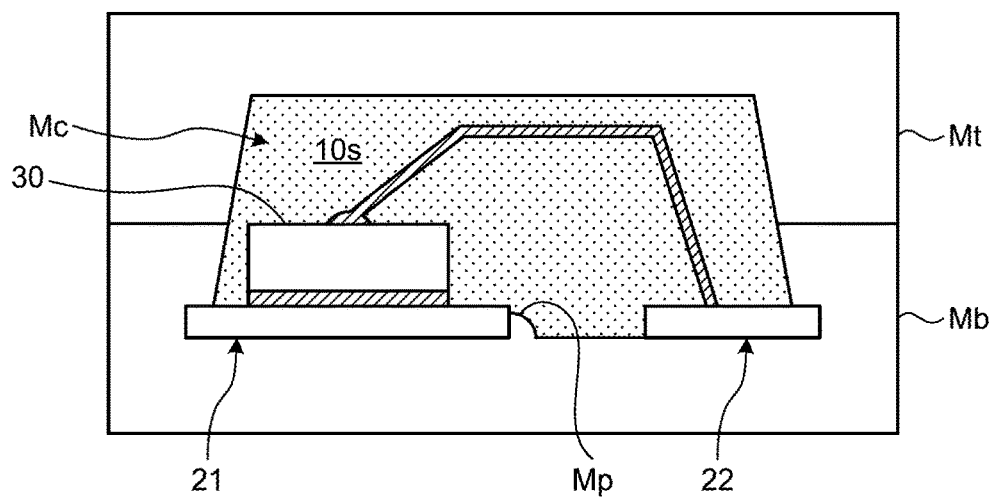
Figure 3C:
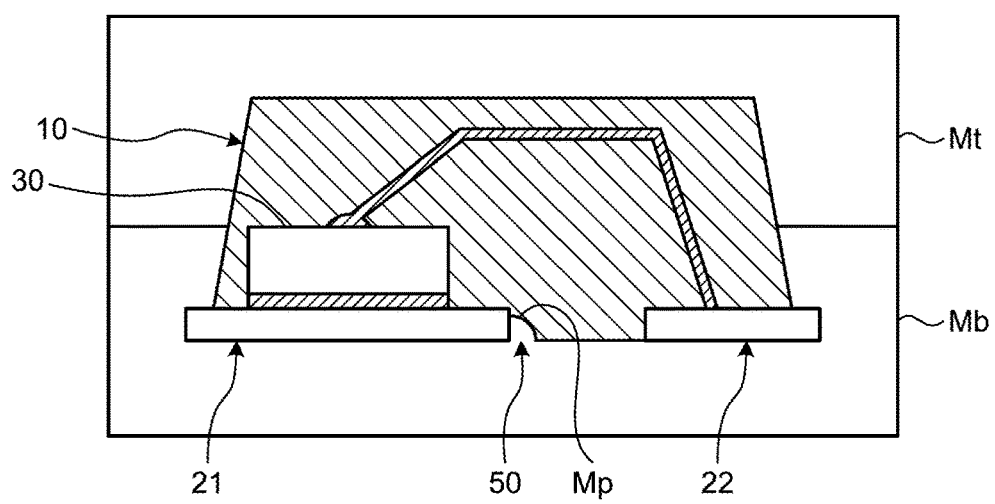

Next, with reference to FIGS. 3A to 3C, an explanation will be given of an example of a method of manufacturing the semiconductor package 1 in the embodiment 1. FIGS. 3A to 3C are sectional views illustrating an example of procedures of a method of manufacturing the semiconductor package according to the embodiment 1. Here, the semiconductor chip 30 is manufactured by a usual semiconductor manufacturing technology, and is bonded to the drain electrode 21, the source electrode 22, the gate electrode 23, and the signal source pin 24. The sealing resin member 10 is formed by a mold technology using, for example, a mold tool (a top mold Mt and a bottom mold Mb), as described below.

As illustrated in FIG. 3A, the semiconductor chip 30 bonded to the drain electrode 21, the source electrode 22, the gate electrode 23, and the signal source pin 24 is placed at a predetermined position in the bottom mold Mb. Here, the bottom mold Mb includes a protrusion Mp in the vicinity of the drain electrode 21, on the surface provided with the drain electrode 21, the source electrode 22, the gate electrode 23, and the signal source pin 24.

As illustrated in FIG. 3B, the bottom mold Mb is combined with the top mold Mt. Consequently, a cavity Mc is formed that contains the semiconductor chip 30 bonded to the drain electrode 21, the source electrode 22, the gate electrode 23, and the signal source pin 24. Then, a resin 10s that has been softened by heating is filled into this cavity Mc.

As illustrated in FIG. 3C, the resin 10s is solidified by cooling, so that the sealing resin member 10 is molded in which the groove 50 is formed by using the protrusion Hp of the bottom mold Mb as a matrix.

In this way, the semiconductor package 1 according to the embodiment 1 is manufactured.

Here, the method of manufacturing the semiconductor package 1 is not limited to the above example. For example, a method may be adopted that molds a resin by a mold tool excluding the protrusion Mp and then forms the groove 50 on the sealing resin member 10 by machining.

For example, in the case of the surface mount type package, the drain electrode has a mounting surface with a relatively large area. Thus, when a solder is used for the mounting on a printed board or the like, gas bubbles may remain inside the solidified solder within the mounting surface of the drain electrode. Consequently, the electric resistance between the semiconductor package and the printed board may increase, or contact failure therebetween may occur.

Further, for example, in recent years, miniaturization is advanced also in semiconductor packages that include power semiconductor devices with high voltage (power devices), such as a high voltage MOS, an Insulated Gate Bipolar Transistor (IGBT), a rectifier diode, and a thyristor, and thus the surface mount type is increasingly adopted for semiconductor packages of this kind as well. In this case, it is considered that the size of each semiconductor package becomes larger, and the area of the drain electrode becomes larger than that of the conventional case, resulting in that gas bubbles are more likely to remain inside the solder.

The present inventor has found that the reason of gas bubbles remaining inside the solder resides in that the mounting surface of the drain electrode is surrounded by the resin of the sealing resin member. Since the resin, which is poor in wettability of the solder, surrounds the mounting surface of the drain electrode, the solder curls up within the mounting surface due to surface tension, and gas bubbles cannot be all released by the time when the solder is solidified.

As a result of intensive studies, the present inventor has come to realize a semiconductor package configuration in which gas bubbles inside the solder can be more easily released.

In the semiconductor package 1 according to the embodiment 1, the groove 50 that communicates the outside of the sealing resin member 10 is provided in contact with the end portion 21s included in the mounting surface 21m of the drain electrode 21.

The end portion 21s of the mounting surface 21m is far from any of the end portions 11e, 11w, 11n, and 11s of the bottom face 11b of the sealing resin member 10, and is considered to be one of the most difficult places for gas bubbles inside the solder to be released, as compared with the other end portions 21e, 21w, and 21n of the mounting surface 21m.

With the configuration described above, when a melted solder is attached to the mounting surface 21m, gas bubbles inside the solder can be easily discharged to the outside of the sealing resin member 10 through the groove 50. Therefore, it is possible to suppress the remaining of gas bubbles inside the solder.

In the semiconductor package 1 according to the embodiment 1, the depth of the groove 50 is less than the thickness of the drain electrode 21. Consequently, outside air can hardly enter inside the sealing resin member 10 from between the groove 50 and the drain electrode 21. Thus, inside the sealing resin member 10, the solder 41 bonding the semiconductor chip 30 to the drain electrode 21 is suppressed from being deteriorated by moisture or the like in the outside air.

In the semiconductor package 1 according to the embodi- ment 1, the lateral surface 52 of the groove 50 is connected to the bottom surface 53 by a curved surface. In the sealing resin member, stress is easily generated at a portion having an angular shape and causes cracks or the like to occur. With the above configuration, the occurrence of cracks on the inner wall of the groove 50 can be suppressed.

In the semiconductor package 1 according to the embodiment 1, the creepage distance CD between the drain electrode 21 and the source electrode 22 is elongated by the groove 50 as compared with a case where the bottom face of the sealing resin member is flat. Consequently, the insulation between the drain electrode 21 and the source electrode 22 can be enhanced.

(Modification 1)

Figure 4:
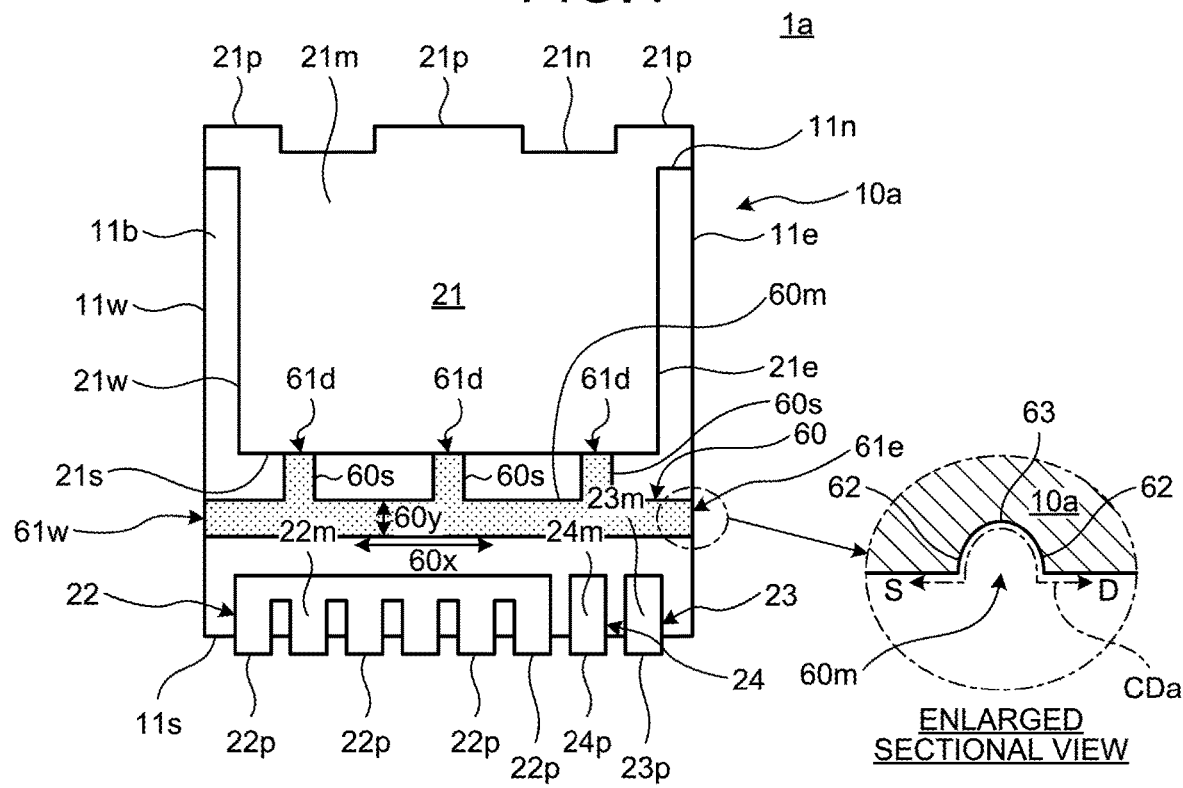
FIG. 4 is a plan view illustrating the bottom face side of a semiconductor package according to a modification 1 of the embodiment 1.

Next, with reference to FIG. 4, an explanation will be given of a semiconductor package 1a according to a modification 1 of the embodiment 1. FIG. 4 is a plan view illustrating the bottom face side of the semiconductor package 1a according to the modification 1 of the embodiment 1. The semiconductor package 1a according to the modification 1 includes a groove 60 different in configuration from that of the embodiment 1 described above.

As illustrated in FIG. 4, the sealing resin member 10a of the semiconductor package is includes the groove 60 as a second groove on the bottom face 11b. The groove 60 includes a main groove 60m and a plurality of sub-grooves 60s.

The main groove 60m is arranged at a position distant from the end portion 21s included in the mounting surface 21m of the drain electrode 21, and extends along the end portion 21s. Two end portions 61e and 61w of the main groove 60m in the extending direction 60x are respectively connected to the lateral faces 12e and 12w of the sealing resin member 10a. Here, each of the end portions 61e and 61w of the main groove 60m in the extending direction 60x is an example of a second connection portion.

Each of the plurality of sub-grooves 60s extends from the main groove 60m to the end portion 21s included in the mounting surface 21m of the drain electrode 21, and is connected to the end portion 21s of the mounting surface 21m by an end portion 61d. Here, the end portion 61d of each of the sub-grooves 60s is an example of a first connection portion.

With the configuration described above, the groove 60 sets the end portion 21s of the mounting surface 21m of the drain electrode 21 to communicate with the outside of the sealing resin member 10a, from the lateral faces 12e and 12w of the sealing resin member 10a. Here, the number of sub-grooves 60s is arbitrary, and it suffices that the groove 60 includes one or more sub-grooves 60s. Also with this arrangement, the end portion 21s of the mounting surface 21m of the drain electrode 21 is set to communicate with the outside of the sealing resin member 10a.

For example, each of the main groove 60m and the sub-grooves 60s has a U-shape in a cross section intersecting with the individual extending direction. Specifically, as illustrated in an enlarged sectional view in FIG. 4, the main groove 60m includes lateral surfaces 62 at the respective opposite end portions in the transverse direction 60y, and the two lateral surfaces 62 extend in the depth direction of the groove 60, and are connected to the respective opposite sides of a bottom surface 63 each by a curved surface. Each of the sub-grooves 60s has substantially the same configuration as described above. Further, at least the depth of each sub-groove 60s is less than the thickness of the drain electrode 21, for example.

Here, the lateral surfaces 62 and the bottom surface 63 of the main groove 60m may be formed planar, and each lateral surface 62 and the bottom surface 63 may be connected in an L-shape in the cross section illustrated in the enlarged sectional view in FIG. 4. This is also true for the sub-grooves 60s.

However, the main groove 60m and the sub-grooves 60s may have cross-sectional areas different from each other. For example, it is possible to adjust the discharging amount of gas bubbles from inside the solder through the sub-grooves 60s, by adjusting the number of sub-grooves 60s. Therefore, the cross-sectional area of each sub-groove 60s may be set smaller than the cross-sectional area of the main groove 60m. The cross-sectional area of each sub-groove 60s may be set smaller by reducing the width of the sub-groove 60s, by reducing the depth of the sub-groove 60s, or by making both of these changes.

Further, since the main groove 60m includes the lateral surfaces 62 on both sides in the transverse direction 60y, the creepage distance between the drain electrode 21 and the source electrode 22 is further elongated as compared with that obtained by the sealing resin member 10 according to the embodiment 1 described above, for example. The enlarged view in FIG. 4 illustrates part of the creepage distance CDa between the drain electrode 21 and the source electrode 22.

In the semiconductor package 1a according to the modification 1, the main groove 60m extending along the end portion 21s of the mounting surface 21m of the drain electrode 21 is set distant from the drain electrode 21, and is connected to the end portion 21s of the mounting surface 21m of the drain electrode 21 by the sub-grooves 60s. Consequently, as compared with the configuration of the embodiment 1, for example, the area of the drain electrode 21 to communicate with outside air is reduced, so that the occurrence of cracks or the like due to deterioration of the solder 41 can be further suppressed.

In the semiconductor package 1a according to the modification 1, the main groove 60m includes the lateral surfaces 62 at the opposite end portions in the transverse direction 60y. Consequently, as compared with the configuration of the embodiment 1, for example, the creepage distance CDa between the drain electrode 21 and the source electrode 22 is longer. Thus, the insulation between the drain electrode 21 and the source electrode 22 is further enhanced.

(Modification 2)

Figure 5:
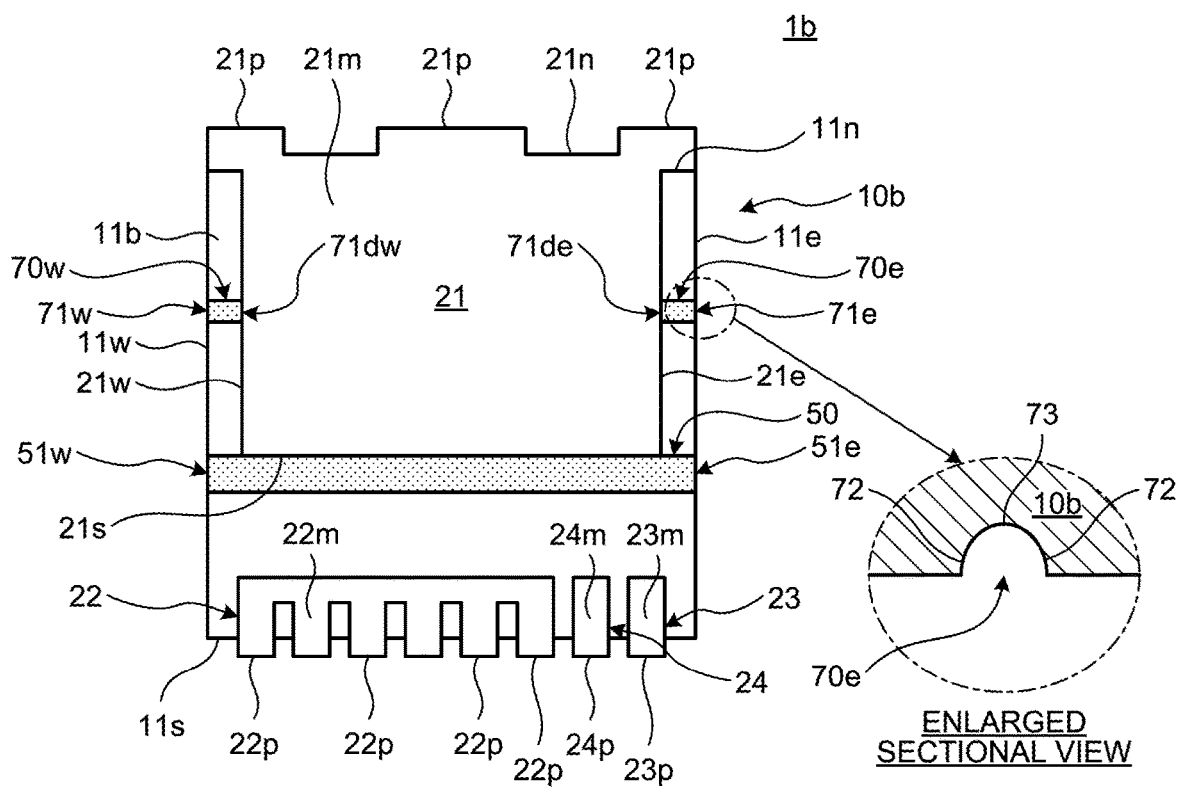
FIG. 5 is a plan view illustrating the bottom face side of a semiconductor package according to a modification 2 of the embodiment 1.

Next, with reference to FIG. 5, an explanation will be given of a semiconductor package 1b according to a modification 2 of the embodiment 1. FIG. 5 is a plan view illustrating the bottom face side of the semiconductor package 1b according to the modification 2 of the embodiment 1. The semiconductor package 1b according to the modification 2 is different from that of the embodiment 1 described above, in that the end portions 21e and 21w of the mounting surface 21m of the drain electrode 21 also include grooves 70e and 70w, respectively.

As illustrated in FIG. 5, the sealing resin member 10b of the semiconductor package 1b includes grooves 70e and 70w as third grooves on the bottom face 11b.

The groove 70e extends from an end portion 71e connected to the lateral face 12e of the sealing resin member 10b to an end portion 71de connected to the end portion 21e of the mounting surface 21m of the drain electrode 21. The groove 70w extends from an end portion 71w connected to the lateral face 12w of the sealing resin member 10b to an end portion 71dw connected to the end portion 21w of the mounting surface 21m of the drain electrode 21.

Here, each of the end portions 71de and 71dw of the grooves 70e and 70w is an example of a first connection portion, and each of the end portions 71e and 71w of the grooves 70e and 70w is an example of a second connection portion.

With the configuration described above, the grooves 70e and 70w set the end portions 21e and 21w of the mounting surface 21m of the drain electrode 21 to communicate with the outside of the sealing resin member 10b, from the respective lateral faces 12e and 12w of the sealing resin member 10b. Here, the number of grooves 70e and 70w is arbitrary, and there may be a plurality of grooves as each of the grooves 70e and 70w. The number of grooves 70e may be different from the number of grooves 70w. Only one of the grooves 70e and 70w may be provided.

For example, each of the grooves 70e and 70w has a U-shape in a cross section intersecting with the individual extending direction. Specifically, as illustrated in an enlarged sectional view in FIG. 5, the groove 70e includes lateral surfaces 72 at the respective opposite end portions in the transverse direction, and the two lateral surfaces 72 extend in the depth direction of the groove 70e, and are connected to the respective opposite sides of a bottom surface 73 each by a curved surface. The groove 70w has substantially the same configuration as described above. Further, the depth of each of the grooves 70e and 70w is less than the thickness of the drain electrode 21, for example.

Further, the grooves 70e and 70w may have a cross-sectional area different from the cross-sectional area of the groove 50. The grooves 70e and 70w may have cross-sectional areas different from each other. As compared with the end portion 21s, the end portions 21e and 21w of the mounting surface 21m of the drain electrode 21 are closer to the end portions 11e and 11w of the bottom face 11b of the sealing resin member 10b, and thus each of the end portion 21e side and the end portion 21w side allows gas bubbles to be relatively easily released from inside the solder during mounting. Therefore, the cross-sectional area of each of the grooves 70e and 70w may be set smaller than the cross-sectional area of the groove 50, for example. The cross-sectional area of each of the grooves 70e and 70w may be set smaller by reducing the width of the grooves 70e and 70w, by reducing the depth of the grooves 70e and 70w, or by making both of these changes.

It should be noted that the groove 50 illustrated in FIG. 5 may be replaced with the groove 60 of the modification 1.

In the semiconductor package 1b according to the modification 2, the grooves 70e and 70w are provided that are connected to the end portions 21e and 21w of the mounting surface 21m of the drain electrode 21.

The end portions 21e and 21w of the mounting surface 21m are present at positions relatively closer to the end portions 11e and 11w of the bottom face 11b of the sealing resin member 10b. However, these end portions 21e and 21w are also arranged in the inner region of the bottom face 11b of the sealing resin member 10b, and are opposed to the resin of the sealing resin member 10b. Therefore, the discharge of gas bubbles inside the solder from these end portions 21e and 21w could also be hindered.

With the configuration described above, it is possible to further suppress the remaining of gas bubbles inside the solder.

Embodiment 2

Next, a detailed explanation will be given of an embodiment 2 with reference to some of the accompanying drawings. A semiconductor package 2 according to the embodiment 2 is different in specification from the semiconductor package 1 according to the embodiment 1 described above.

(Configuration Example of Semiconductor Package)

Figure 6A:
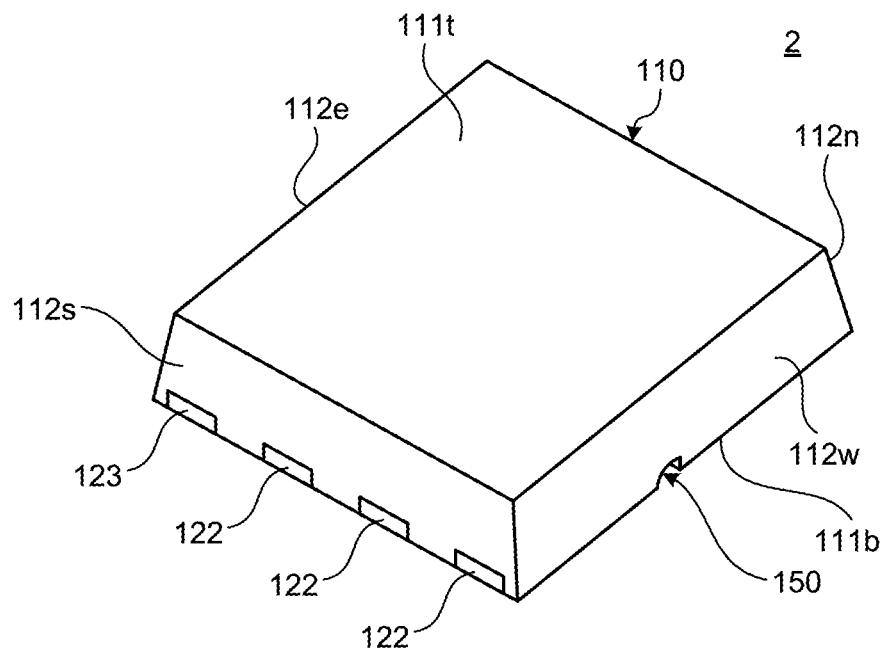
FIGS. 6A and 6B are perspective views illustrating a configuration example of a semiconductor package according to an embodiment 2.
Figure 6B:
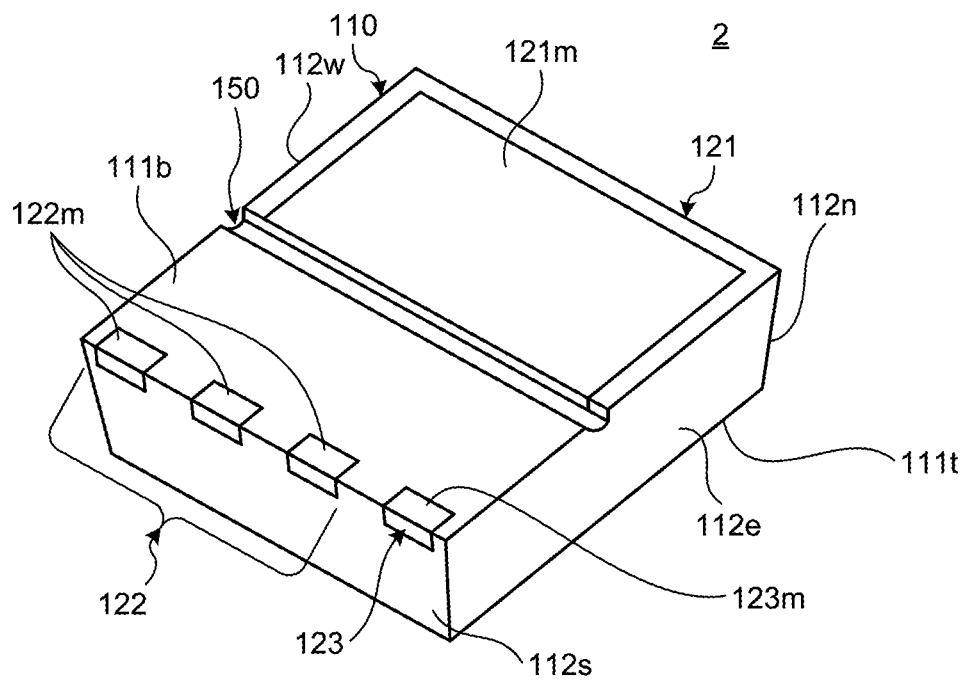

FIGS. 6A and 6B are perspective views illustrating a configuration example of the semiconductor package 2 according to the embodiment 2. FIG. 6A illustrates the top face side of the semiconductor package 2, and FIG. 6B illustrates the bottom face side of the semiconductor package 2.

In the following description, the constituent elements of the embodiment 2 corresponding to those of the embodiment 1 are denoted by the corresponding reference symbols in the 100s, in the drawings and the description. However, when constituent elements of these embodiments corresponding to each other are substantially the same in configuration and function as each other, the description of the corresponding constituent element of the embodiment 2 may be omitted.

Specifically, for example, a sealing resin (sealing resin member, sealing resin material) 110 of FIGS. 6A and 6B includes lateral faces 112e, 112w, 112n, and 112s, which respectively correspond to the lateral faces 12e, 12w, 12n, and 12s of the sealing resin member 10 of the embodiment 1 described above. These lateral faces 112e, 112w, 112n, and 112s are substantially the same in configuration and function as the lateral faces 12e, 12w, 12n, and 12s.

As illustrated in FIGS. 6A and 6B, the semiconductor package 2 includes a sealing resin member 110, a drain electrode 121, source electrodes 122, and a gate electrode 123. Further, the semiconductor package 2 includes a semiconductor chip (not illustrated) inside the sealing resin member 110. For example, the semiconductor chip may be such a semiconductor chip or the like that includes a MOSFET or the like formed therein, as in the semiconductor chip 30 of the embodiment 1 described above.

The semiconductor package 2 may have a smaller outer shape and a smaller thickness than those of the semiconductor package 1 of the embodiment 1 described above, for example. For example, the semiconductor package 2 is configured as a surface mount type package, and, more specifically, may be formed of a Dual Flat No-lead (DFN) package, for example.

The sealing resin member 110 includes a groove 150 as a first groove on the bottom face 111b.

The drain electrode 121 as a first electrode includes a mounting surface 121m as a first mounting surface, which is surrounded by the resin of the bottom face 111b of the sealing resin member 110, for example.

The source electrodes 122 as second electrodes include mounting surfaces 122m as second mounting surfaces, which are arranged at one end portion of the bottom face 111b of the sealing resin member 110, for example. The source electrodes 122 are composed of a plurality of individually independent plate-like members or the like, which are also exposed on the lateral face 112s of the sealing resin member 110, for example.

The gate electrode 123 as a third electrode includes a mounting surface 123m as a third mounting surface, which is arranged at one end portion of the bottom face 111b of the sealing resin member 110, for example, where this end portion is on the same side as the mounting surfaces 122m of the source electrodes 122. The gate electrode 123 is formed of a plate-like member or the like, which is also exposed on the lateral face 112s of the sealing resin member 110, for example.

The mounting surface 121m of the drain electrode 121 has an area larger than that of each of the mounting surfaces 122m and 123m of the source electrodes 122 and the gate electrode 123, for example. However, the mounting surface 121*m* of the drain electrode 121 may be configured smaller than the mounting surface 21*m* of the drain electrode 21 of the embodiment 1 described above, because of a reason that, for example, the outer shape of the semiconductor package 2 is configured smaller than that of the semiconductor package 1 of the embodiment 1 described above, or the like.

Figure 7A:
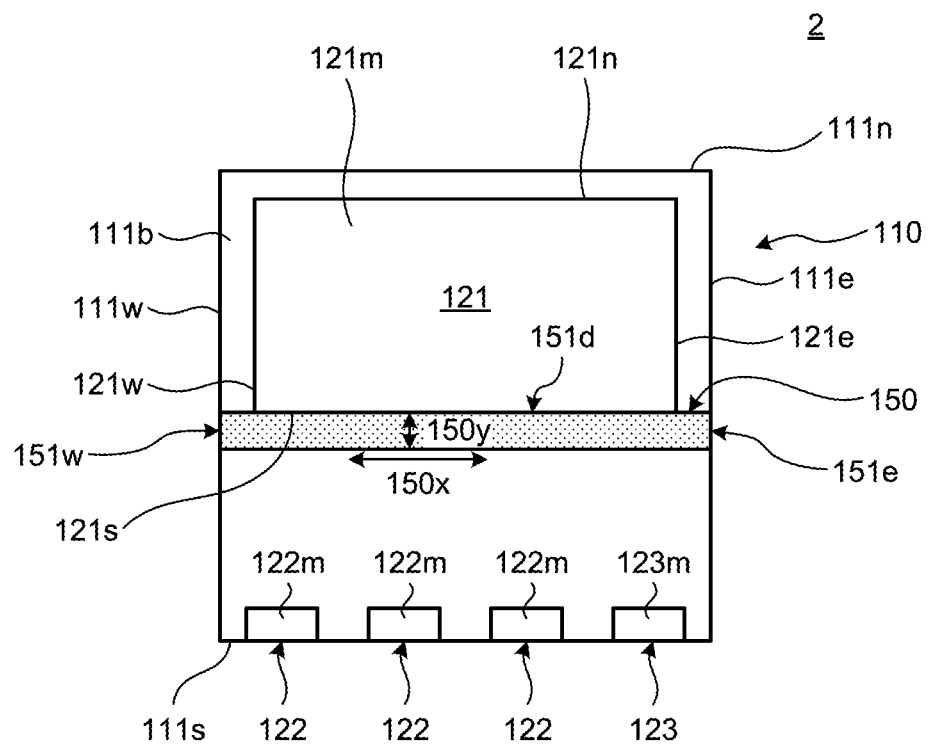
FIGS. 7A and 7B are schematic diagrams illustrating the bottom face side of the semiconductor package according to the embodiment 2.
Figure 7B:
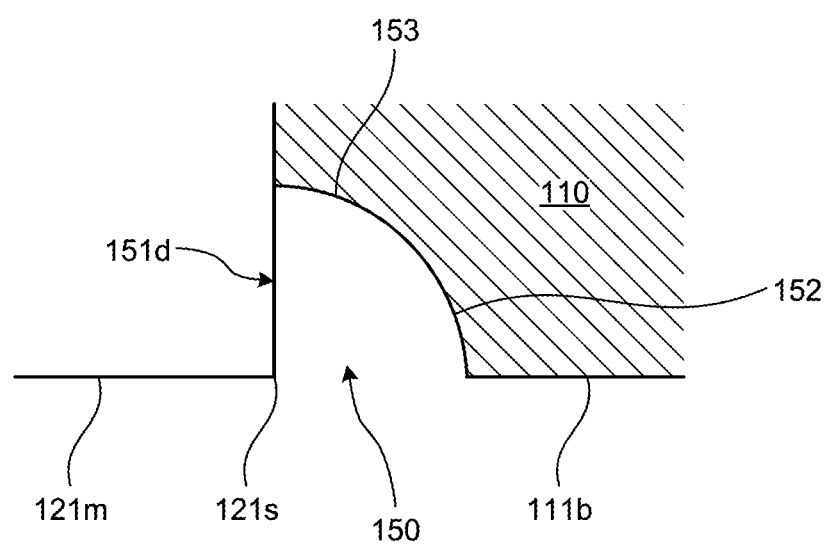

FIGS. 7A and 7B are schematic diagrams illustrating the bottom face side of the semiconductor package 2 according to the embodiment 2. FIG. 7A is a plan view illustrating the bottom face side of the semiconductor package 2, and FIG. 7B is an enlarged sectional view of the semiconductor package 2 along the extending direction of the lateral faces 112*e* and 112*w* of the sealing resin member 110.

As illustrated in FIG. 7A, the mounting surface 121*m* of the drain electrode 121 includes end portions 121*e*, 121*w*, 121*n*, and 121*s*, all of which are arranged, for example, in the inner region of the bottom face 111*b* of the sealing resin member 110. Thus, as described above, the mounting surface 121*m* is surrounded by the resin of the bottom face 111*b* of the sealing resin member 110.

The end portion 121*n* as a second end portion of the mounting surface 121*m* is present in the vicinity of the end portion 111*n* of the bottom face 111*b* of the sealing resin member 110, and is opposed to the end portion 111*n*. Accordingly, also in the configuration of the embodiment 2, the end portion 121*s* as a first end portion of the mounting surface 121*m* is considered to be one of the most difficult places for gas bubbles inside the solder to be released, as compared with the other end portions 121*e*, 121*w*, and 121*n*.

As illustrated in FIGS. 7A and 7B, the groove 150 formed on the bottom face 111*b* of the sealing resin member 110 includes an end portion 151*d* in the transverse direction 150*y*, which is connected to the end portion 121*s* of the mounting surface 121*m* of the drain electrode 121. Further, the groove 150 includes end portions 151*e* and 151*w* in the extending direction 150*x*, which are respectively connected to the lateral faces 112*e* and 112*w* of the sealing resin member 110. Further, the groove 150 includes a lateral surface 152 extending in the depth direction of the groove 150, and a bottom surface 153 connected to the lateral surface 152 by a curved surface. The end portion 151*d* of the groove 150 is an example of a first connection portion, and each of the end portions 151*e* and 151*w* of the groove 150 is an example of a second connection portion.

As illustrated in FIG. 7B, the cross-sectional area of the groove 150 in a direction intersecting with the extending direction 150*x* can be adjusted in accordance with the easiness for gas bubbles to be released from inside the solder on the mounting surface 121*m* of the drain electrode 121, for example. For example, as described above, in a case where the mounting surface 121*m* of the drain electrode 121 has a relatively small area, or the like, because of a reason that the outer shape of the semiconductor package 2 is smaller than that of the semiconductor package 1 of the embodiment 1 described above, or the like, the cross-sectional area of the groove 150 described above may be set smaller than the cross-sectional area of the corresponding cross section of the groove 50 of the embodiment 1, for example.

In the semiconductor package 2 of the embodiment 2 configured as described above may be manufactured by procedures substantially the same as those for the semiconductor package 1 of the embodiment 1 described above, for example. For example, the sealing resin member 110 may be formed by using a mold tool, and the groove 150 may be formed by a mold technology using part of this mold tool as a matrix, or may be formed by machining or the like after molding of the sealing resin member 110.

In the semiconductor package 2 according to the embodiment 2, it is possible to provide effects substantially the same as those of the semiconductor package 1 of the embodiment 1 described above.

(Modification 1)

Figure 8:
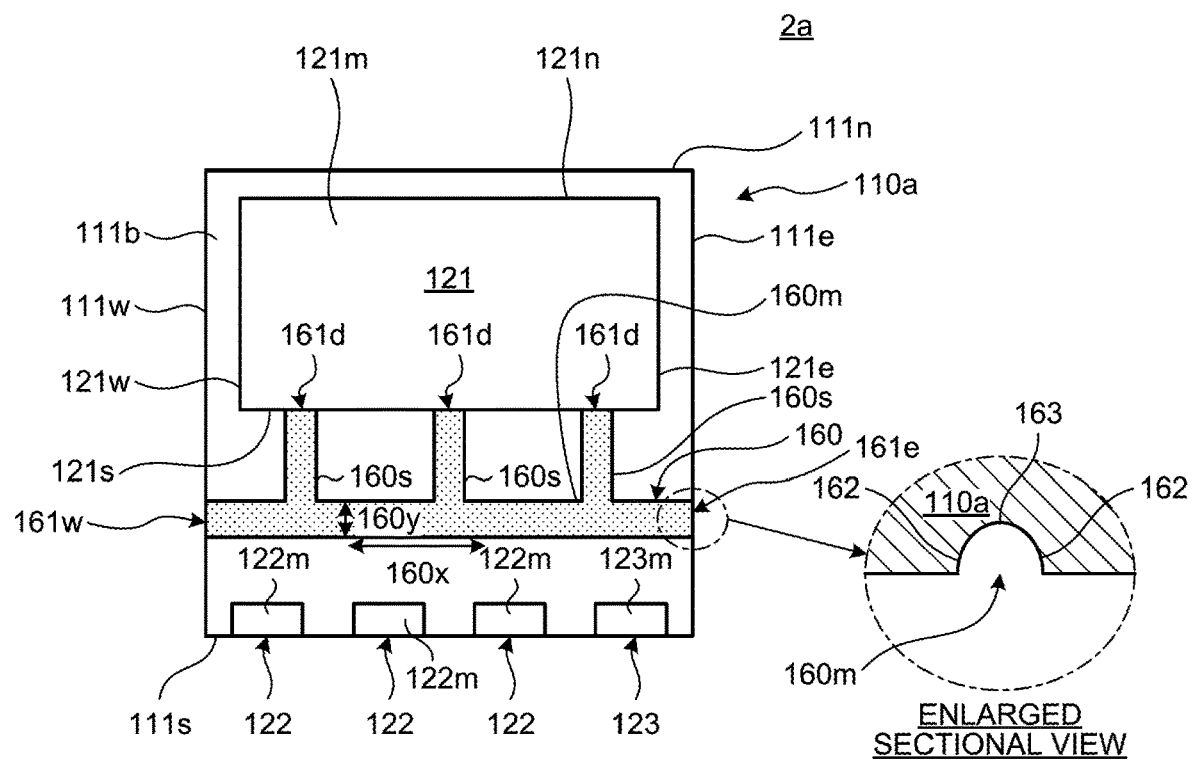
FIG. 8 is a plan view illustrating the bottom face side of a semiconductor package according to a modification 1 of the embodiment 2.

Next, with reference to FIG. 8, an explanation will be given of a semiconductor package 2*a* according to a modification 1 of the embodiment 2. FIG. 8 is a plan view illustrating the bottom face side of the semiconductor package 2*a* according to the modification 1 of the embodiment 2. The semiconductor package 2*a* according to the modification 1 includes a groove 160 that corresponds to the groove 60 included in the semiconductor package 1*a* according to the modification 1 of the embodiment 1 described above.

The groove 160 as a second groove includes a main groove 160*m* and a plurality of sub-grooves 160*s*.

The main groove 160*m* includes end portions 161*e* and 161*w* connected to the lateral faces 112*e* and 112*w* of the sealing resin member 110*a*. Further, the main groove 160*m* includes lateral surfaces 162 extending in the depth direction of the main groove 160*m* at the opposite end portions in the transverse direction of the main groove 160*m*, and a bottom surface 163 connected to each of the lateral surfaces 162 by a curved surface.

Each of the sub-grooves 160*s* includes an end portion 161*d* connected to the end portion 121*s* of the mounting surface 121*m* of the drain electrode 121. Further, each sub-groove 160*s* includes lateral surfaces (not illustrated) extending in the depth direction of the sub-groove 160*s* at the opposite end portions in the transverse direction of the sub-groove 160*s*, and a bottom surface (not illustrated) connected to each of the lateral surfaces by a curved surface.

Here, each of the end portions 161*e* and 161*w* of the main groove 160*m* in the extending direction 160*x* is an example of a second connection portion, and the end portion 161*d* of each sub-groove 160*s* is an example of a first connection portion.

As illustrated in an enlarged sectional view in FIG. 8, the cross-sectional area of the main groove 160*m* in a direction intersecting with the extending direction 160*x* can be adjusted in accordance with the easiness for gas bubbles to be released from inside the solder on the mounting surface 121*m* of the drain electrode 121, for example. For example, as described above, in a case where the mounting surface 121*m* of the drain electrode 121 has a relatively small area, or the like, because of a reason that the outer shape of the semiconductor package 2*a* is smaller than that of the semiconductor package 1*a* of the embodiment 1 described above, or the like, the cross-sectional area of the main groove 160*m* described above may be set smaller than the cross-sectional area of the corresponding cross section of the main groove 60*m* of the modification 1 of the embodiment 1, for example.

Further, it is possible to adjust the discharging amount of gas bubbles from inside the solder also by adjusting the cross-sectional area of each sub-groove 160*s* in a direction intersecting with the extending direction 160*x*, the number of sub-grooves 160*s*, and/or the like.

In the semiconductor package 2*a* according to the modification 1, it is possible to provide effects substantially the same as those of the semiconductor package 1*a* according to the modification 1 of the embodiment 1 described above.

(Modification 2)

Figure 9:
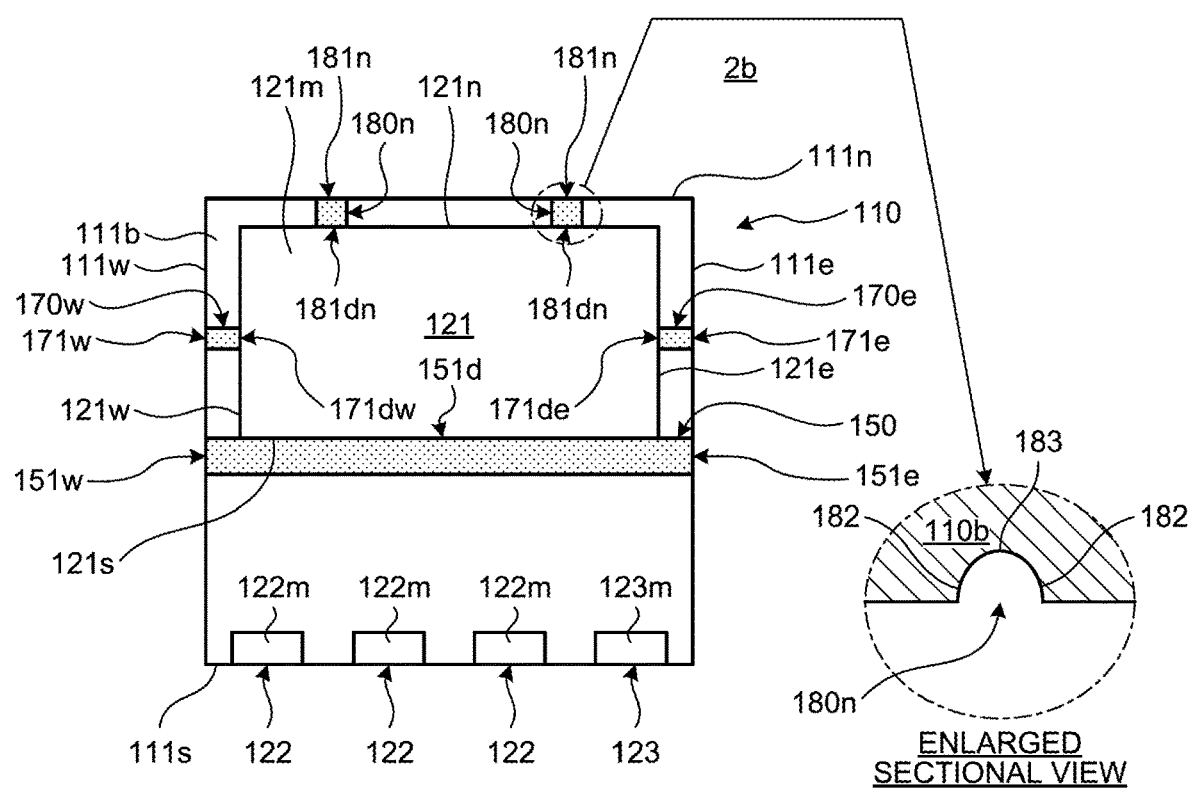
FIG. 9 is a plan view illustrating the bottom face side of a semiconductor package according to a modification 2 of the embodiment 2.

Next, with reference to FIG. 9, an explanation will be given of a semiconductor package 2*b* according to a modification 2 of the embodiment 2. FIG. 9 is a plan view illustrating the bottom face side of the semiconductor package 2b according to the modification 2 of the embodiment 2. The semiconductor package 2b according to the modification 2 includes grooves 170e and 170w that correspond to the grooves 70e and 70w included in the semiconductor package 1b according to the modification 2 of the embodiment 1 described above.

The groove 170e as a third groove includes an end portion 171e connected to the lateral face 112e of the sealing resin member 110b, and an end portion 171d e connected to the end portion 121e of the mounting surface 121m of the drain electrode 121. Further, the groove 170e includes lateral surfaces (not illustrated) extending in the depth direction of the groove 170e at the opposite end portions in the transverse direction of the groove 170e, and a bottom surface (not illustrated) connected to each of the lateral surfaces by a curved surface.

The groove 170w as a third groove includes an end portion 171w connected to the lateral face 112w of the sealing resin member 110b, and an end portion 171d w connected to the end portion 121w of the mounting surface 121m of the drain electrode 121. Further, the groove 170w includes lateral surfaces (not illustrated) extending in the depth direction of the groove 170w at the opposite end portions in the transverse direction of the groove 170w, and a bottom surface (not illustrated) connected to each of the lateral surfaces by a curved surface.

Here, each of the end portions 171de and 171dw of the grooves 170e and 170w is an example of a first connection portion, and each of the end portions 171e and 171w is an example of a second connection portion.

Further, a plurality of grooves 180n are provided as third grooves on the bottom face 111b of the sealing resin member 110b.

Each of the plurality of grooves 180n extends from an end portion 181n connected to the lateral face 112n of the sealing resin member 110b to an end portion 181dn connected to the end portion 121n of the mounting surface 121m of the drain electrode 121.

Here, the end portion 181dn of each groove 180n is an example of a first connection portion, and the end portion 181n of each groove 180n is an example of a second connection portion.

With the configuration described above, the grooves 180n set the end portion 121n of the mounting surface 121m of the drain electrode 121 to communicate, from the lateral face 112n of the sealing resin member 110b, with the outside of the sealing resin member 110b. Here, the number of grooves 180n is arbitrary, and it suffices that one or more grooves 180n are provided.

As illustrated in an enlarged sectional view in FIG. 9, each groove 180n includes lateral surfaces 182 at the respective opposite end portions in the transverse direction, and the two lateral surfaces 182 extend in the depth direction of the groove 180n, and are connected to the respective opposite sides of a bottom surface 183 each by a curved surface. Further, the depth of each groove 180n is less than the thickness of the drain electrode 121, for example.

Further, each groove 180n may have a cross-sectional area different from the cross-sectional area of the groove 150. Each groove 180n and each of the grooves 170e and 170w may have cross-sectional areas different from each other. As compared with the end portion 121s, the end portion 121n of the mounting surface 121m of the drain electrode 121 are closer to the end portion 111n of the bottom face 111b of the sealing resin member 110b, and thus the end portion 121n side allows gas bubbles to be relatively easily released from inside the solder during mounting. Therefore, the cross-sectional area of each groove 180n may be set smaller than the cross-sectional area of the groove 150, for example.

In the semiconductor package 2b according to the modification 2, it is possible to provide effects substantially the same as those of the semiconductor package 1b according to the modification 2 of the embodiment 1 described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package comprising:
    a semiconductor chip;
    a sealing resin that has a flat plate shape and seals the semiconductor chip inside;
    a first electrode that includes a first mounting surface exposed on a first main face of the sealing resin;
    a second electrode that includes a second mounting surface exposed on the first main face; and
    a groove provided on the first main face,
    wherein
    the first mounting surface includes a first end portion arranged in an inner region of the first main face and opposed to the second electrode, and
    the groove includes
    a first connection portion connected to the first end portion, and
    a second connection portion connected to a lateral face of the sealing resin.

2. The semiconductor package according to claim wherein
    the groove includes a first groove extending in contact with the first end portion and along the first end portion,
    the first connection portion includes one end portion of the first groove in a transverse direction, and
    the second connection portion includes one end portion of the first groove in an extending direction.

3. The semiconductor package according to claim 2, wherein the second connection portion includes opposite end portions of the first groove in the extending direction.

4. The semiconductor package according to claim wherein
    the groove includes a second groove that includes
    a main groove extending along the first end portion, at a position distant from the first end portion, and
    a sub-groove extending from the main groove to the first end portion,
    the first connection portion includes one end portion of the sub-groove, which extends to the first end portion, and
    the second connection portion includes one end portion of the main groove in an extending direction.

5. The semiconductor package according to claim 4, wherein the second connection portion includes opposite end portions of the main groove in the extending direction.

6. The semiconductor package according to claim 1, wherein the first mounting surface has an area larger than that of the second mounting surface.

7. The semiconductor package according to claim wherein
the first electrode is a drain electrode, and
the second electrode is a source electrode.

8. The semiconductor package according to claim wherein
the first mounting surface includes a second end portion arranged in the inner region and opposed to an end portion of the first main face,
the groove includes a third groove extending from an end portion of the first main face to the second end portion,
the first connection portion includes one end portion of the third groove, which extends to the second end portion, and
the second connection portion includes another end portion of the third groove.

9. The semiconductor package according to claim 8, wherein
the first end portion extends in a predetermined direction, and
the second end portion extends in a direction intersecting with an extending direction of the first end portion.

10. The semiconductor package according to claim 9, wherein the second end portion is arranged on each side in the extending direction of the first end portion.

11. The semiconductor package according to claim 8, wherein
the first end portion extends in a predetermined direction, and
the second end portion extends in a direction along the extending direction of the first end portion.

12. The semiconductor package according to claim 1, wherein the groove has a depth smaller than a thickness of the second electrode.

13. The semiconductor package according to claim 1, wherein
the groove includes a lateral surface and a bottom surface, and
the lateral surface is connected to the bottom surface by a curved surface.

14. The semiconductor package according to claim 1, further comprising a third electrode that includes a third mounting surface exposed on the first main face and is opposed to the first end portion from a side of the second electrode.

15. The semiconductor package according to claim 14, wherein the first mounting surface has an area larger than that of the third mounting surface.

16. The semiconductor package according to claim 14, wherein the third electrode is a gate electrode.

17. The semiconductor package according to claim 1, wherein the semiconductor chip is a power semiconductor chip.

18. The semiconductor package according to claim 1, wherein the semiconductor package is a surface mount type package.

* * * * *